United States Patent

Hsieh et al.

[11] Patent Number: 5,956,590
[45] Date of Patent: *Sep. 21, 1999

[54] PROCESS OF FORMING A FIELD EFFECT TRANSISTOR WITHOUT SPACER MASK EDGE DEFECTS

[75] Inventors: Yong-Fen Hsieh; Shu-Jen Chen, both of Hsinchu; Joe Ko, Hsin-Chu, all of Taiwan

[73] Assignee: United Microelectronics Corp., Hsin-Chu, Taiwan

[*] Notice: This patent is subject to a terminal disclaimer.

[21] Appl. No.: 08/907,242

[22] Filed: Aug. 6, 1997

Related U.S. Application Data

[63] Continuation of application No. 08/450,300, May 25, 1995, abandoned.

[51] Int. Cl.$^6$ .................................................. H01L 21/265
[52] U.S. Cl. .......................... 438/303; 438/231; 438/304; 438/305
[58] Field of Search ........................ 438/231, 303–305, 438/620, 648, 304

[56] References Cited

U.S. PATENT DOCUMENTS

| | | | |
|---|---|---|---|
| 4,876,213 | 10/1989 | Pfiester | 437/44 |
| 4,997,777 | 3/1991 | Boivin | 437/38 |
| 5,350,698 | 9/1994 | Huang et al. | 437/41 GS |
| 5,424,234 | 6/1995 | Kwon | 437/44 |
| 5,441,599 | 8/1995 | Reinhardt | 437/44 |
| 5,482,895 | 1/1996 | Hayashi et al. | 437/200 |
| 5,508,215 | 4/1996 | Jeng | 437/38 |
| 5,512,516 | 4/1996 | Nishida et al. | 437/200 |

FOREIGN PATENT DOCUMENTS

| | | | |
|---|---|---|---|
| 1-25481 | 1/1989 | Japan | 437/40 GS |
| 3-76126 | 8/1989 | Japan . | |
| 3-46275 | 2/1991 | Japan | 437/44 |
| 3-76126 | 4/1991 | Japan | 437/44 |
| 6-163572 | 6/1994 | Japan | 437/44 |

OTHER PUBLICATIONS

S.Wolf & R.N. Tauber, "Silicon Processing for the VLSI Era" vol. 1, pp. 398–399, Aug. 1990.
S. Wolf, "Silicon Processing for the VLSI Era", vol. II, pp. 198, 333, 354–357, 360–363, Jun. 1990.
J.J. Sanchez et al. IEEE Trans. Electron Dev. 36(6)(1989)1125 "Drain Engineered . . . Review", Jun. 1989.
S. Wolf Silicon Processing for the VLSI Era, vol. II pp. 328,332–334, Jun. 1996.
J Sacchez Drain engineereed hot electron resistant device structures IEEE Transactions on electron Devices vol. 36 No. 6 Jun. 1989.
S. Wolf Silicon Processing For the VSLI Era vol. 2 Lattice Press pp. 198, 199,328,332–333,354–357, 360–363, 1990.
S Wolf Silicon Processing For the VSLI Era vol. 3 Lattice Press p. 610, 1995.

*Primary Examiner*—Charles Bowers
*Assistant Examiner*—David S Blum
*Attorney, Agent, or Firm*—Rabin & Champagne, P.C.

[57] ABSTRACT

A field effect transistor which is not susceptible to mask edge detects at its gate spacer oxides. The transistor is formed upon a semiconductor substrate through successive layering of a gate oxide, a gate electrode and a gate cap oxide. A pair of curved gate spacer oxides are then formed covering opposite edges of the stack of the gate oxide, the gate electrode and the gate cap oxide. The semiconductor substrate is then etched to provide a smooth topographic transition from the gate spacer oxides to the etched semiconductor surface. Source/drain electrodes are then implanted into the etched semiconductor substrate and annealed to yield the finished transistor. A second embodiment of the field effect transistor possesses a polysilicon gate. Alter removal of the gate cap oxide, a metal layer may be deposited and sintered upon the polysilicon gate and the source/drain electrodes. The metal salicide layers formed upon the electrodes of the transistor have limited susceptibility to parasitic current leakage.

24 Claims, 6 Drawing Sheets

PROCESS OF FORMING A FIELD EFFECT TRANSISTOR WITHOUT SPACER MASK EDGE DEFECTS

This is a continuation of application Ser. No. 08/450,300 filed on May 25, 1995, now abandoned.

BACKGROUND OF THE INVENTION

1. Field of the Invention

The present invention relates to a method for forming a field effect transistor upon a semiconductor substrate in a fashion whereby the completed transistor does not exhibit mask edge detects adjoining its gate spacer oxides. More particularly, the present invention relates to a method for forming a smooth topographic transition between the gate spacer oxides of a field effect transistor and the semiconductor substrate adjoining those gate spacer oxides, so that mask edge detects are not produced at regions adjoining the gate spacer oxides when amorphous source/drain electrodes of the transistor are annealed.

2. Description of Related Art

With the advent of advanced generations of semiconductor transistor technology, such as Very Large Scale Integrated (VLSI) circuit technology and Ultra Large Scale Integrated (ULSI) circuit technology, there is a substantial and continuing interest in understanding the sources and control of detects which contribute to semiconductor functionality and reliability losses. Such detects may arise from several sources. Typical defect sources include semiconductor manufacturing environments, manufacturing processes, process tooling and materials.

With regard to detects whose sources derive from manufacturing processes and materials, it is well known in the art that several types of defects may be formed through the process of implanting dopant ions into semiconductor substrates to form active semiconductor regions. It is also well known that the high ion implant doses required for formation of many advanced semiconductor circuit components simultaneously make amorphous the crystalline silicon semiconductor substrate into which the dopant ions are implanted. Upon subsequent annealing to recrystallize the amorphous region, latent defects are formed or appear at locations within or adjoining the recrystallized region.

Defects which are incident to annealing and recrystallization of amorphous ion implanted semiconductor substrates fall into three categories. The first two categories are Projected Range Defects (PRDs) and End of Range Detects (ERDs) These defects appear as dislocations within the depth of a semiconductor substrate which has been ion implanted and recrystallized. The location and density of these defects derives from the intensity and dose of the implanting ions which caused the initial crystalline to amorphous transition of the semiconductor substrate.

The third category of detect related to recrystallization of a silicon semiconductor substrate made amorphous through ion implantation is the Mask Edge Detects (MEDs). In contrast to PRDs and ERDs, MEDs are defects typically localized to the surface of the recrystallized semiconductor substrate. In particular, MEDs are formed at locations where a recrystallizing silicon substrate surface adjoins another structure on the surface of the silicon substrate. A common structure adjoining which an MED may be formed is a gate spacer oxide structure. Gate spacer oxides are formed to insulate the gate electrode edge surfaces from the adjoining source/drain electrodes in field effect transistor structures. When formed in this location, an MED is commonly referred to as a gate spacer MED. It is towards the elimination of these gate spacer MEDs that the present invention is directed.

A second type of semiconductor fabrication defect which is nominally unrelated to defects associated with ion implantation processes is parasitic current leakage between polysilicon gate electrodes and source/drain electrodes upon which electrodes have been formed metal salicide layers. A metal salicide layer is a metal silicide layer which is formed in a self aligned fashion. Such parasitic leakage is known to occur due to encroachment of the salicide layers upon the surfaces of semiconductor structures which separate the polysilicon gate electrode and the source/drain electrodes. The reduction in magnitude of this parasitic leakage current, either in conjunction or independent of elimination of gate spacer MEDs, is a desirable goal in light at the shrinking physical dimensions of advanced semiconductor devices.

Schematic diagrams which illustrate the formation of gate spacer MEDs and metal salicide layer encroachment within field effect transistor device structures are shown in FIG. 1a, FIG. 1b, FIG. 2a and FIG. 2b. The formation of gate spacer MEDs is shown in FIG. 1a and FIG. 1b. FIG. 1a shows a cross-sectional diagram of a field effect transistor at a point in its processing where a high dose ion implant has been made into the semiconductor substrate for the purpose of establishing the source/drain electrodes of the semiconductor device. As is common in advanced semiconductor devices, the ion implant was of sufficient dose to make amorphous the silicon semiconductor substrate into which it was implanted.

In FIG. 1a, a semiconductor substrate 10 has formed upon its surface a gate electrode 12 which is separated from the semiconductor substrate 10 by a gate oxide 14. On both sides of the gate electrode 12 are formed gate spacer oxides 16 which insulate the gate electrode 12 from source/drain electrodes 18. Also formed within the surface of the semiconductor substrate 10 are low dose ion implants 20, which are of sufficiently low dose that the semiconductor substrate 10 regions into which they are implanted remain crystalline.

The purpose of the low dose ion implants 20 is to reduce the peak electric field within the semiconductor substrate 10 such that electrons within the semiconductor substrate 10 are not injected into the gate oxide 14. The use of low dose ion implants 20 implants becomes more important as transistor device dimensions are reduced while maintaining constant supply voltages. Adjoining the low dose ion implants 20 are high dose ion implanted regions which form the source/drain electrodes 18. The dose of the high dose ion implant is sufficient to make amorphous the source/drain electrodes 18.

FIG. 1b shows the same cross-sectional diagram as shown in FIG. 1a after the semiconductor structure has been annealed to recrystallize the amorphous source/drain electrodes 18. As the amorphous semiconductor regions recrystallize, the recrystallization interface advances towards: (1) the edges of the gate spacer oxides 16, and (2) the interfaces with the low dose ion implants 20. At these interfaces, gate spacer MEDs 22 are formed. The gate spacer MEDs 22 are manifested as cracks through the semiconductor substrate 10 at its juncture with the gate spacer oxides 16. The gate spacer MEDs 22 may be accompanied by additional secondary and tertiary detects. These additional defects and dislocations, if formed, are often localized to the area of the semiconductor substrate beneath the gate oxide 14.

Correlating with FIG. 1a and FIG. 1b are FIG. 2a and FIG. 2b. FIG. 2a shows a cross-sectional schematic diagram equivalent to the diagram of FIG. 1a with a significant limitation and a related exception. The limitation is that the gate electrode 12 of FIG. 1a is now a polysilicon gate electrode 13. The related exception is that a metal layer 24 has been deposited over the surface of the entire semiconductor structure. The metal deposited in the metal layer 24 is chosen such that it will form a metal salicide upon sintering with silicon surfaces which it contacts. Metals which are known to form such salicides include but are not limited to cobalt, tantalum, platinum, tungsten and titanium.

FIG. 2b shows a cross-sectional diagram of the semiconductor structure shown in FIG. 2a after the simultaneous annealing to recrystallize the amorphous ion implanted source/drain electrodes 18 and sintering to form metal salicide layers on silicon surfaces contacted by the metal layer 24 of FIG. 2a. Unreacted portions of the metal layer 24 of FIG. 2a are absent from FIG. 2b. They may be removed through a selective etch process appropriate to the metal from which is formed metal layer 24.

Analogously to FIG. 1b, FIG. 2b also shows gate spacer MEDs 22 which are formed upon recrystallization of source/drain electrodes 18. Also shown in FIG. 2b are a gate electrode metal salicide layer 26 and a pair of source/drain electrode metal salicide layers 28. Shown in FIG. 2b are the overhangs of the gate electrode metal salicide layer 26 onto the tops of the gate spacer oxides 16 and the encroachment of the source/drain electrode metal salicide layers 28 onto the vertical edges of the gate spacer oxides 16. The overhangs and encroachments, if pronounced, may lead to parasitic leakage currents between the polysilicon gate electrode 13 and the source/drain electrodes 18. The reduction of these parasitic effects is a desirable feature for advanced field effect transistors.

The presence and the mechanism of formation of MEDs has been discussed in the art. For example, Tsui, et al., "Impact of Structure Enhanced Detects Multiplication on Junction Leakage," Technical Digest of the International Reliability Physics Symposium 383 (1994), discusses junction leakage due to MEDs and dislocations associated with polysilicon layers on field oxide (FOX) structures within semiconductor substrates. Modification of various process parameters, including implantation dosage, screen oxide parameters and post-implant annealing parameters were shown to slightly suppress, but not eliminate, the leakage current.

More pertinent to the present invention, however, is the disclosure by Horiuchi, et al., "Gate Edge Effects on SPE Regrowth From As+ Implanted Si," Nuclear Instrumentation Methods in Physics Research B37/38 285 (1989). Within that disclosure, Horiuchi et al. discuss the strong dependence of MEDs upon the geometry of the amorphous implanted area beneath a gate edge. The presence of MEDs was found to depend little on gate material, but substantially upon substrate orientation with respect to gate direction. Based upon these observations, Horiuchi, et al. suggest methods to eliminate MEDs which involve: (1) geometric considerations of masking layers with regard to substrate orientation, and (2) kinetics of amorphous substrate recrystallization as related substrate orientation.

Absent from the prior art is the suggestion that modifications to semiconductor substrate topography may play a significant role in eliminating gate spacer MEDs. Also absent from the prior art is the suggestion that inventions directed towards eliminating gate spacer MEDs may consequentially also reduce parasitic leakage in field effect transistors upon whose electrodes are formed metal salicide layers.

SUMMARY OF THE INVENTION

A first object of the present invention is to provide a readily manufacturable method for forming a field effect transistor structure which is not susceptible to MEDs at the juncture of a gate spacer oxide of the transistor with the semiconductor substrate upon which the transistor is fabricated.

A second object of the present invention is to provide a method in accord with the first object of the present invention, which method may be practiced without concern for the crystallographic orientation of the semiconductor substrate upon which the transistor is fabricated.

A third object of the present invention to provide a method in accord with the first and second objects of the present invention, which method may be practiced without regard to geometric considerations pertaining to recrystallization kinetics of transistor source/drain electrodes made amorphous through high dose ion implants.

In accord with the objects of the present invention, a new method for fabricating a field effect transistor which is not susceptible to MEDs at the juncture of its gate spacer oxide with the semiconductor substrate upon which it is formed is described.

The method for forming the field effect transistor of the present invention starts with providing a semiconductor substrate which has formed upon its surface a gate electrode aligned over a gate oxide and a gate cap oxide aligned over the gate electrode. Covering a pair of parallel edges of the gate oxide, the gate electrode and the gate cap oxide are then formed a pair of curved gate oxide spacers. The semiconductor substrate adjoining the gate spacer oxides is then etched to provide a pair of etched semiconductor substrate surfaces which provide a smooth topographic transition from the gate spacer oxides. A high dose ion implant is then provided into the semiconductor substrate beneath the etched semiconductor substrate surfaces, thus forming a pair of source/drain electrodes within the semiconductor substrate. Finally, the source/drain electrodes are annealed.

The transistor structure formed in accord with the method of the present invention is readily manufacturable. It possesses a minimal number of additional process steps in comparison with methods for forming field effect transistor structures which are known in the art. The additional process steps relate to: (1) forming the gate cap oxide which resides on the top surface of the gate electrode, and (2) the etching of the semiconductor substrate to form etched semiconductor substrate surfaces which provide a smooth topographic transition from the gate spacer oxides.

The method of the present invention may be practiced without consideration for either: (1) the crystallographic orientation of the semiconductor substrate upon which is formed the field effect transistor of the present invention, or (2) recrystallization kinetics of source/drain electrodes made amorphous through the high dose ion implants at the present invention. The method at the present invention relates to the topography at the semiconductor substrate upon which the field effect transistors of the present invention are formed, not the crystallographic orientation or recrystallization kinetics of amorphous regions within that semiconductor substrate.

Finally, although not a primary object of the present invention, the method of the present invention also provides a gate electrode which is recessed within the gate spacer oxides of the transistor structure of the present invention, and source/drain electrodes which are recessed within the semiconductor substrate upon which the transistor structure of the present invention is fabricated. Since these electrodes are recessed, metal salicide layers formed upon the surfaces of these electrodes are contained and restricted, thus providing limited opportunity for parasitic leakage between the gate electrode and the source/drain electrodes due to bridging and encroachment of metal salicide layers.

BRIEF DESCRIPTIONS OF THE DRAWINGS

DESCRIPTION OF THE PREFERRED EMBODIMENTS

Figure 1A:
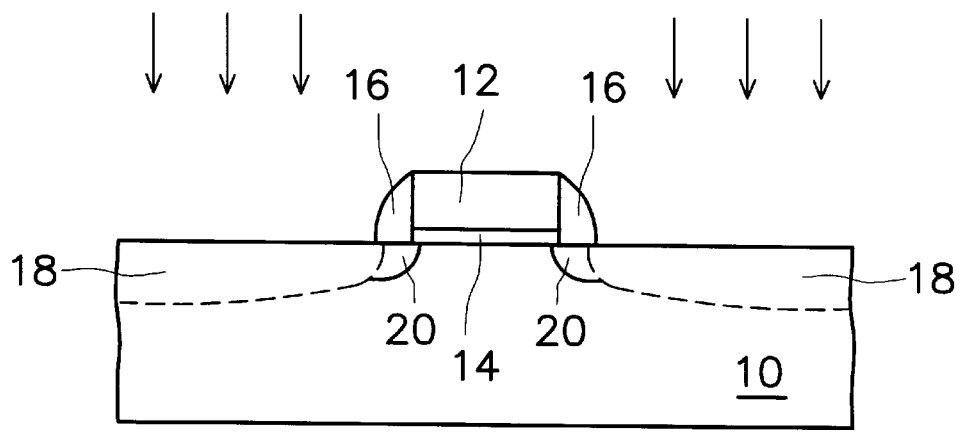
FIG. 1a and FIG. 1b show cross-sectional schematic diagrams of conventional field effect transistors of the prior art showing the formation of spacer mask edge defects.
Figure 1B:
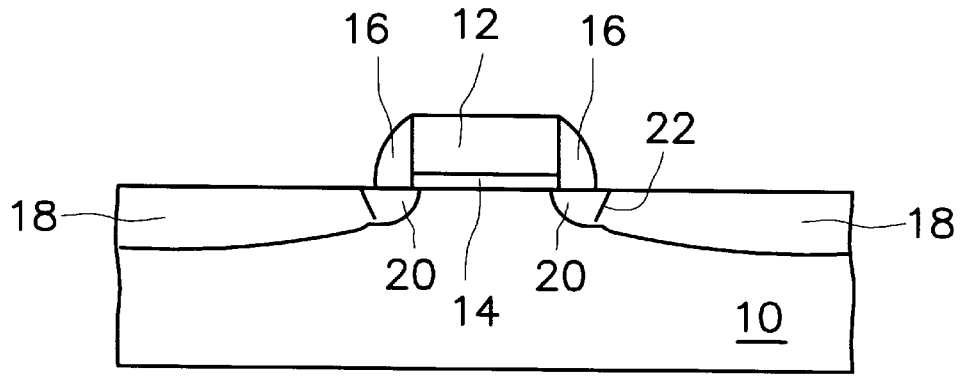
Figure 2A:
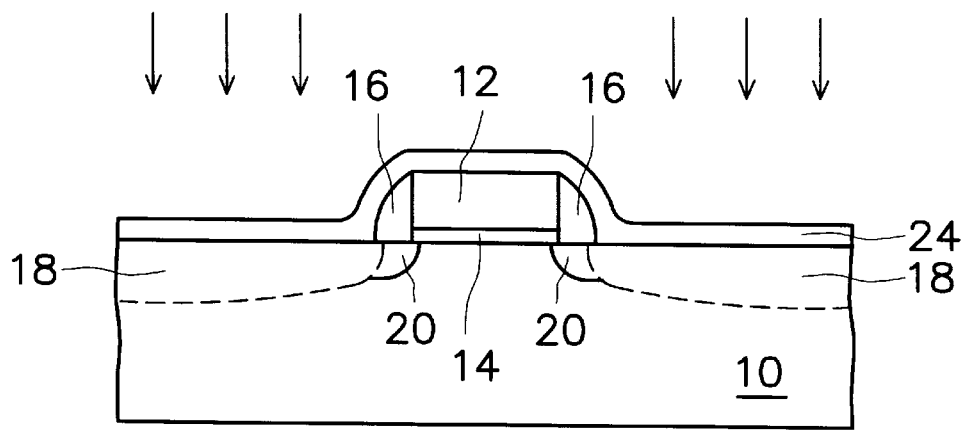
FIG. 2a and FIG. 2b show cross-sectional schematic diagrams of conventional field effect transistors of the prior art showing the formation of spacer mask edge detects and metal salicide encroachment.
Figure 2B:
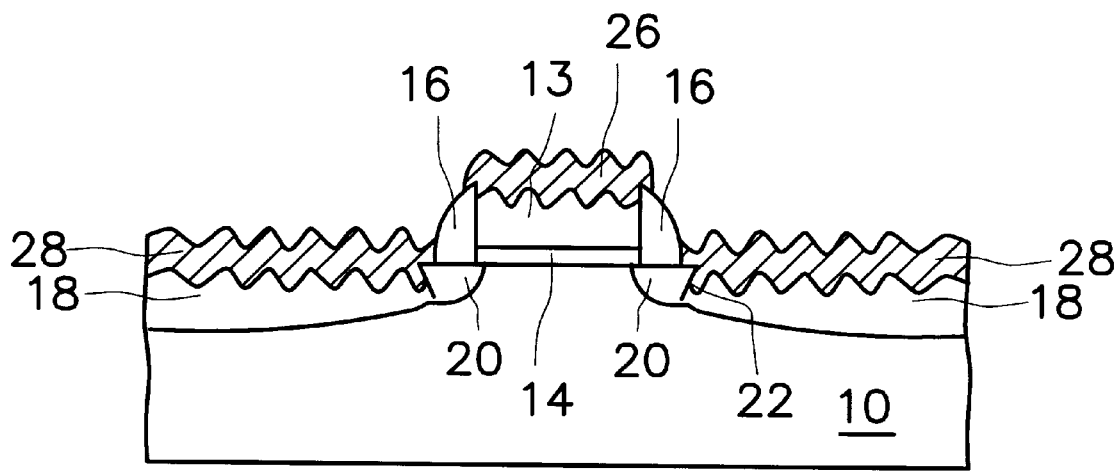
Figure 3:
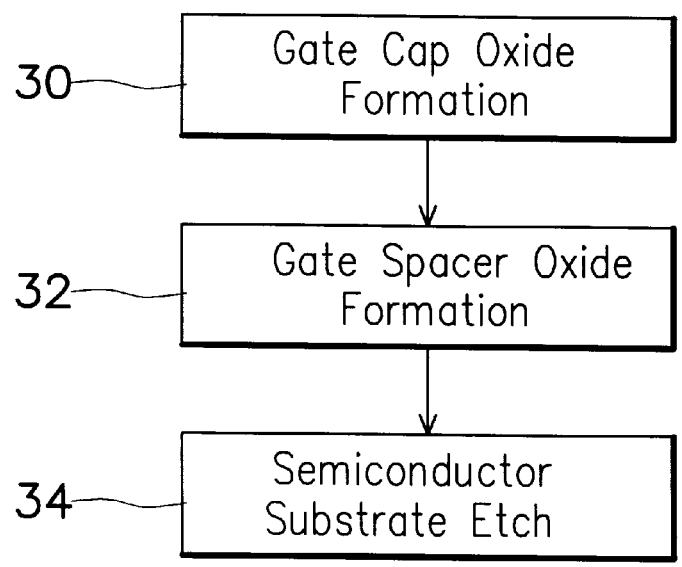
FIG. 3 shows a schematic diagram of the process steps critical to practice of the present invention.

Referring the FIG. 3, there is shown the flow of process steps critical to formation of field effect transistor structures of the present invention, which transistor structures are not susceptible to formation of gate spacer MEDs at the edges of their gate spacer oxides. The method of the present invention may be used in the formation of any field effect transistor known in the art where a gate spacer oxide structure adjoins a semiconductor substrate at a high angle of incidence. The method of the present invention may be practiced upon N channel field effect transistors and P channel field effect transistors. Alternatively, the method of the present invention may also be practiced upon semiconductor substrates which have alternating regions of N and P doping, thus providing complementary arrays of N channel field effect transistors and P channel field effect transistors.

Step 30 of FIG. 3 shows the formation of a gate cap oxide. The gate cap oxide is formed over the gate electrode of the field effect transistor of the present invention. The gate electrode is separated from the semiconductor substrate by a gate oxide. The purpose of the gate cap oxide is to protect the gate electrode from subsequent etching processes in practice of the present invention. The gate cap oxide of the present invention is preferably formed through a Low Pressure Chemical Vapor Deposition (LPCVD) process using Tetra Ethyl Ortho Silicate (TEOS) as the silicon source material. The gate cap oxide may be selectively removed from the gate electrode preferably through a hydrofluoric acid etching process or a selective Reactive Ion Etch (RIE) process. The preferred gate cap oxide thickness for practice of the present invention is from about 250 to about 1000 angstroms.

Referring again to FIG. 3, step 32 shows the next critical step in the formation of field effect transistors of the present invention, which step involves the formation of the gate spacer oxides. A pair of gate spacer oxides are formed at a pair of parallel edges of the stack of the gate oxide, the gate electrode and the gate cap oxide. The gate spacer oxides will have a curvature leading from a thicker cross-section at the bottom at the gate spacer oxide to a thinner cross-section at the top of the gate spacer oxide which adjoins and covers the edge of the gate cap oxide.

Similarly to the gate cap oxide, the gate spacer oxides are also preferably formed from a material which is deposited through a Low Pressure Chemical Vapor Deposition (LPCVD) process using Tetra Ethyl Ortho Silicate (TEOS) as the silicon source material. The material from which the gate spacer oxides are formed is etched in the curved shape of the gate spacer oxides through an anisotropic Reactive Ion Etch (RIE) process. The preferred thickness of the gate spacer oxides at their bottom ends is from about 1500 to about 2500 angstroms each.

Referring again to FIG. 3, there is shown in step 34 the semiconductor substrate etch process step, which is the process step critical to formation of the field effect transistor of the present invention. The semiconductor substrate etch removes substrate material adjoining the gate spacer oxides. It is critical to practice of the present invention that the semiconductor substrate etched at those regions adjoining the gate spacer oxides be etched in a fashion which forms a smooth topographic transition from the gate spacer oxides to the etched surfaces of the semiconductor substrate.

There are several methods known in the art by which a silicon semiconductor substrate may be etched. Methods include, but are not limited to wet chemical etch methods, Reactive Ion Etch (RIE) plasma methods, and magnetically enhanced plasma methods. For the present invention, it is preferred that the silicon semiconductor substrate be etched through a selective Reactive Ion Etch (RIE) process. Specifically, it is preferred that the selective Reactive Ion Etch process have an etch rate for silicon in excess of seven times the etch rate for silicon oxide. Using this process, it is preferred that about 250 to about 1000 angstroms of the semiconductor substrate be removed from those surfaces of the semiconductor substrate adjoining the gate spacer oxides.

Referring now more particularly to FIG. 4a to FIG. 4e there is shown a series of schematic cross-sectional diagrams of a field effect transistor at progressive stages in the fabrication processes of the first preferred embodiment of the present invention. Field effect transistor structures formed in accord with the critical process steps of FIG. 3 are incorporated into the diagrams of FIG. 4a to FIG. 4c.

Figure 4A:
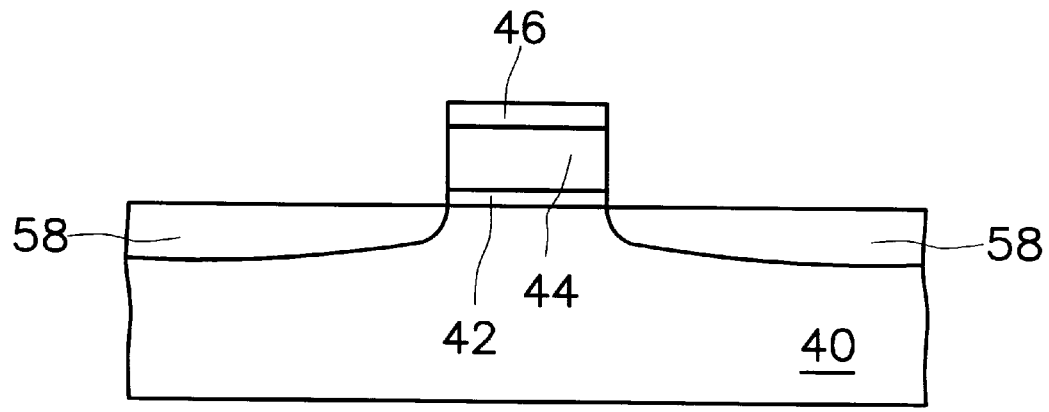
FIG. 4a to FIG. 4e show cross-sectional schematic diagrams of field effect transistor structures in accord with the first preferred embodiment of the present invention.

FIG. 4a shows a silicon semiconductor substrate 40 having upon its surface a gate electrode 44 which is separated from the semiconductor substrate 40 by a gate oxide 42. Formed upon the surface of the gate electrode 44 is a gate cap oxide 46. The gate oxide 42, the gate electrode 44 and the gate cap oxide 46 are all commonly known in the art.

The gate oxide 42 may be formed through oxidation of the semiconductor substrate 40 or through formation and patterning of a layer of deposited oxide. Deposition methods for oxides include, but are not limited to, Chemical Vapor Deposition (CVD) methods and Plasma Enhanced Chemical Vapor Deposition (PECVD) methods. For the present invention the gate oxide 42 is typically formed through a thermal oxidation process and the gate oxide 42 has a typical thickness from about 75 to about 150 angstroms.

The gate electrode 44 of the first embodiment of the present invention may be formed from several conducting materials as are known in the art. Typical conducting materials include refractory metals, metal alloys and polysilicon. The gate electrode 44 of the present invention must be able to withstand the temperature extremes through which it may be exposed in subsequent processing steps of the present invention. The preferred material for the gate electrode 44 for the first preferred embodiment of the present invention is polysilicon deposited through a Low Pressure Chemical Vapor Deposition (LPCVD) process to yield a typical gate electrode 44 thickness of about 2000 to about 5000 angstroms.

The gate cap oxide 46 is a critical element of the present invention. It is formed from a Low Pressure Chemical Vapor Deposition (LPCVD) process using Tetra Ethyl Ortho Silicate (TEOS) as the silicon source material. The preferred gate cap oxide 46 thickness is from about 250 to about 1000 angstroms.

The last feature of FIG. 4a is the presence of a pair of low dose ion implants 58 at regions of the semiconductor substrate 40 adjoining the gate electrode 44. Although they are not critical to the present invention, the purpose of the low dose ion implants 58 is to form a graded junction from the source/drain electrode which is subsequently formed within the semiconductor substrate 40. The graded junction reduces the peak electric field within the semiconductor substrate 40 such that electrons within the semiconductor substrate 40 are not injected into the gate oxide 42. The presence of a graded junction becomes more important as transistor device dimensions are reduced while maintaining constant supply voltages.

In addition to forming a graded junction through the use of low dose ion implants 58, it is also possible to form a graded junction through use two coincident ion implants when forming source/drain electrodes. Typically, one of the ion implants is a phosphorus ion implant and the other ion implant is an arsenic ion implant. Due to different diffusion coefficients of phosphorus and arsenic is silicon, a graded junction is formed upon annealing a source/drain electrode formed in this fashion. This latter approach to forming a graded junction is commonly referred to as a Double Doped Drain (DDD). The low dose ion implant approach to forming a graded junction is commonly referred to as a Low Dose Drain (LDD). The present invention may be practiced upon semiconductor substrates having a Low Dose Drain ion implant structure, a Double Doped Drain ion implant structure or a conventional single ion implant structure for the source/drain electrodes.

The low dose ion implants 58 are provided through ion implantation techniques as are know in the art. For the first embodiment of the present invention, the low dose ion implants 58 are preferably phosphorus ion implants at an ion implant dose of about 1E12 to about 1E13 ions per square centimeter and an ion implantation energy of about 30 to about 50 keV. Under these conditions, the regions of the semiconductor substrate 40 into which the low dose ion implants 58 are made will remain crystalline.

Figure 4B:
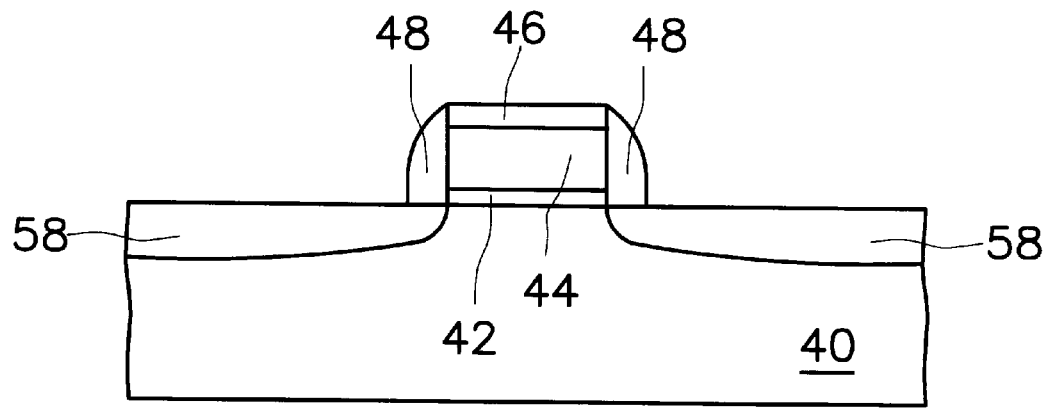

Referring now to FIG. 4b, there is shown a cross-sectional diagram which corresponds to the next step in the processing of the field effect transistor of the first preferred embodiment of the present invention. FIG. 4b shows the formation of a pair of gate spacer oxides 48 covering a pair of the parallel edges of the gate oxide 42, the gate electrode 44 and the gate cap oxide 46. The gate spacer oxides 48 are a critical element to forming the field effect transistor of the present invention. The gate spacer oxides 48 are preferably formed through etching of a blanket silicon oxide layer formed upon the semiconductor substrate through a Low Pressure Chemical Vapor Deposition (LPCVD) process using Tetra Ethyl Ortho Silicate (TEOS) as the silicon source material. The blanket silicon oxide layer is preferably formed into the gate spacer oxides 48 through an anisotropic Reactive Ion Etch (RIE) etch process. The preferred thickness of the gate spacer oxides 48 at their bottom ends is from about 1500 to about 2500 angstroms each.

Figure 4C:
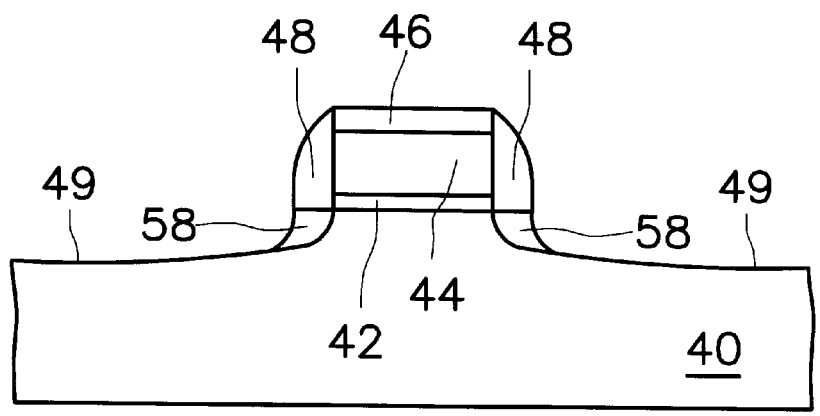

Referring now to FIG. 4c there is shown a cross-sectional schematic diagram corresponding to the next step in the fabrication of the field effect transistor of the first preferred embodiment of the present invention. FIG. 4c shows the etching step which yields a pair of etched semiconductor substrate surfaces 49 upon the semiconductor substrate 40. The etch step is critical to practice of the present invention. It is preferred that the silicon semiconductor substrate 40 be etched through a selective Reactive Ion Etch process. Specifically, it is preferred that the selective Reactive Ion Etch process have an etch rate for silicon in excess of seven times the etch rate for silicon oxide. Using this process, it is preferred that about 250 to about 1000 angstroms of the semiconductor substrate 40 be removed from those surfaces of the semiconductor substrate 40 adjoining the gate spacer oxides 48 to form the etched semiconductor substrate surfaces 49.

Figure 4D:
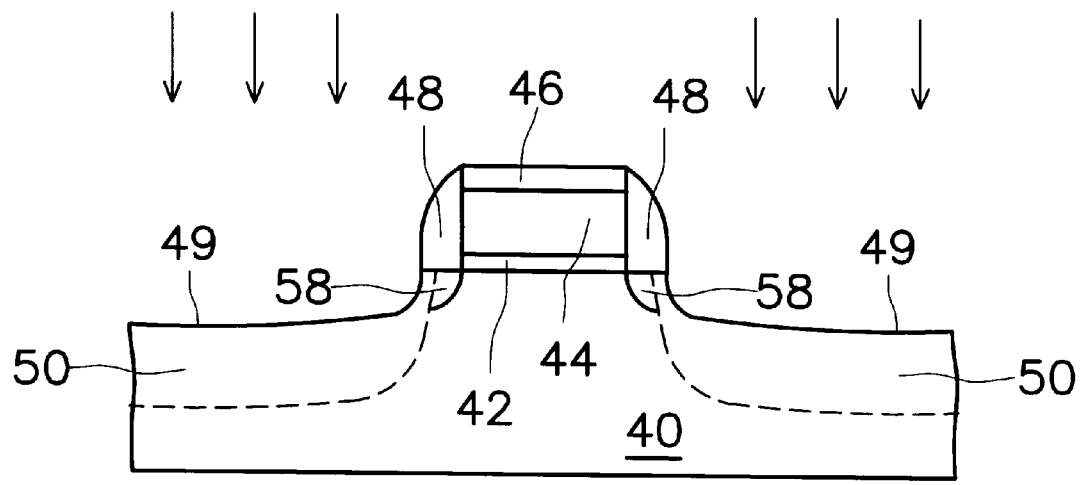

Referring now to FIG. 4d there is shown the next process step in forming the field effect transistor of the first preferred embodiment of the present invention. FIG. 4d shows the source/drain electrodes 50 formed into the semiconductor substrate 40 through a high dose ion implant. The polarity of the high dose ion implant is the same as the polarity of the low dose ion implants 58. Similarly to the low dose ion implants 58, the source/drain electrodes 50 may be formed through high dose ion implant techniques as are known in the art. For the first preferred embodiment of the present invention, the source/drain electrodes are formed through a high dose arsenic ion implant at about 1E15 to about 1E16 ions per square centimeter dose and about 40 to about 80 keV ion implantation energy. Under these ion implantation conditions, the semiconductor substrate 40 from which is formed the source/drain electrodes 50 is made amorphous.

Figure 4E:
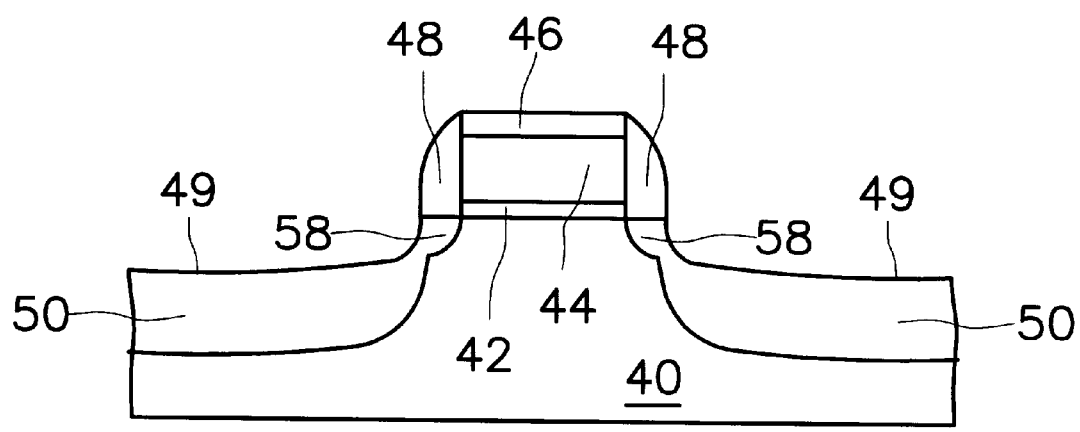

Referring now to FIG. 4e there is shown a cross-sectional schematic diagram of a field effect transistor corresponding to the last process step in the first preferred embodiment of the present invention. In FIG. 4e the portion of the semiconductor substrate 40 which was made amorphous through the high dose ion implantation to form the source/drain electrodes 50 is now annealed to recrystallize the source/drain electrodes 50.

Annealing of semiconductor substrate 40 may be accomplished through several methods as are known in the art. Annealing may be accomplished through exposure of a semiconductor surface to thermal energy or other types of energy which may be absorbed by the semiconductor surface. Such other types of energy include but are not limited to laser light energy, ultraviolet light energy, and halogen light energy. For the present invention, it is preferred to thermally anneal the semiconductor substrate 40 within which is contained the source/drain electrodes 50 at a temperature at about 550 to about 900 degrees centigrade for a time period of about 30 to about 60 minutes. Noticeably absent upon annealing of the field effect transistor of the first preferred embodiment of the present invention are gate spacer oxide mask edge detects at the juncture of the gate spacer oxides 48 with the source/drain electrodes 50.

Referring now to FIG. 5a to FIG. 5f there are shown cross-sectional schematic diagrams of a field effect transistor structure at various stages of processing in accord with the second preferred embodiment of the present invention.

Figure 5A:
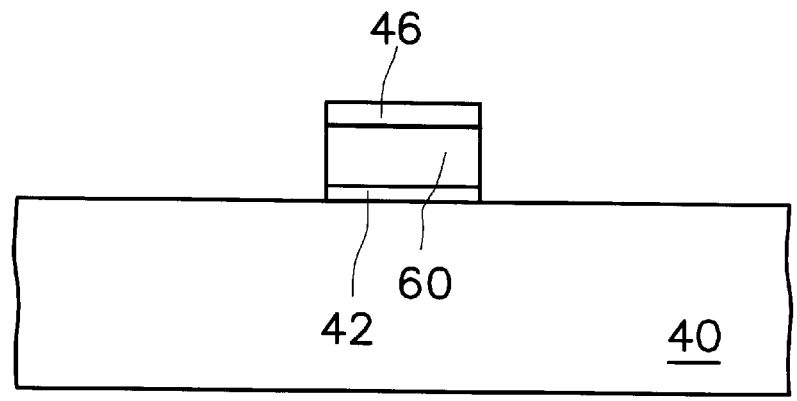
FIG. 5a to FIG. 5f show cross-sectional schematic diagrams of field effect transistor structures in accord with the second preferred embodiment of the present invention.
Figure 5B:
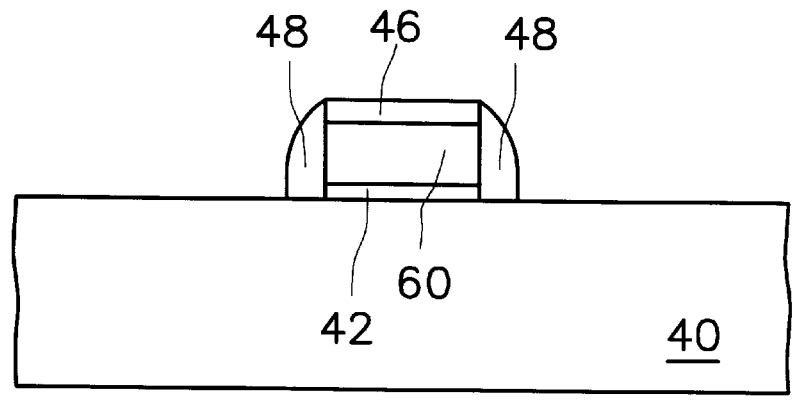
Figure 5C:
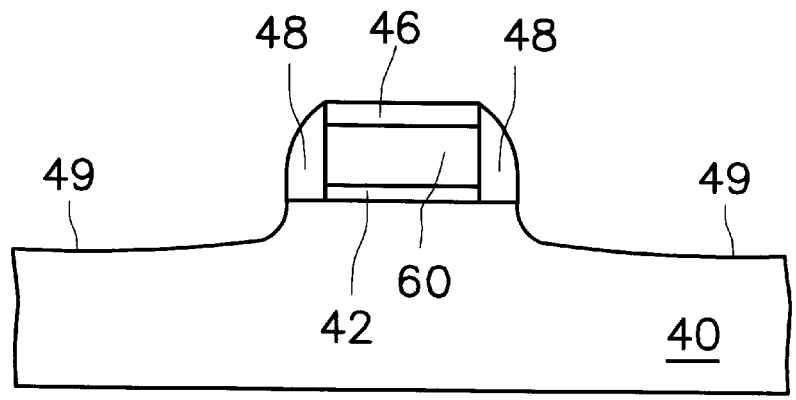

Referring to FIG. 5a to FIG. 5c there are shown schematic cross-sectional diagrams of the second preferred embodiment of the present invention which correspond to cross-sectional diagrams of the first preferred embodiment shown in FIG. 4a to FIG. 4c, with two exceptions. The first exception is the omission at the low dose ion implants 58 which were used in the first preferred embodiment of the present invention. Notwithstanding the absence of low dose ion implants 58 from FIG. 5a to FIG. 5b, the second preferred embodiment of the present invention may nonetheless also be practiced with a Lightly Doped Drain ion implant structure. Similarly to the first preferred embodiment of the present invention, the second preferred embodiment of the present invention may be practiced upon semiconductor substrates having a Low Dose Drain ion implant structure, a Double Doped Drain ion implant structure or a conventional single ion implant structure for the source/drain electrodes.

The second exception is that the gate electrode 44 of the first preferred embodiment of the present invention is exclusively a polysilicon gate electrode 60 in the second preferred embodiment of the present invention. In addition, field effect transistor structures formed in accord with the critical process steps of FIG. 3 are incorporated into the diagrams at FIG. 5a to FIG. 5c.

Figure 5D:
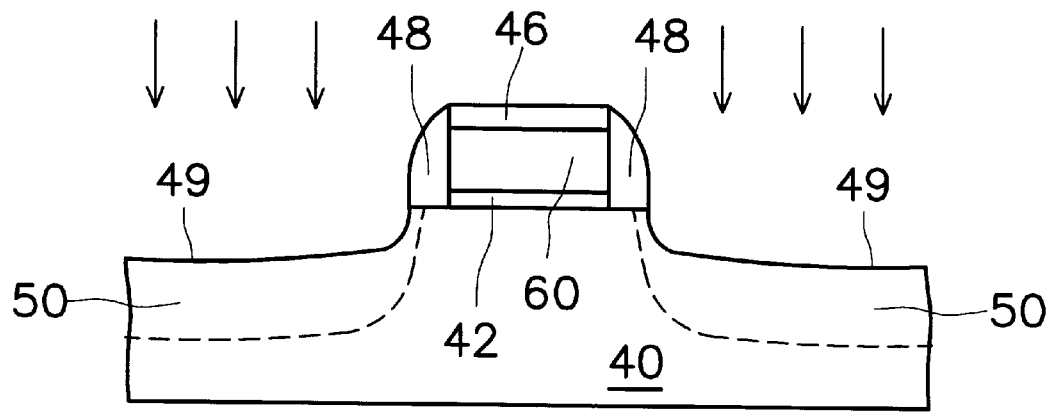

Referring now to FIG. 5d, there is shown a cross-sectional schematic diagram of a field effect transistor illustrating the next process step of the second preferred embodiment of the present invention. The diagram of FIG. 5d is analogous to the diagram of FIG. 4d. Both diagrams illustrate the formation at amorphous source/drain electrodes 50 through a high dose ion implant into the semiconductor substrate 40 beneath the etched semiconductor substrate surfaces 49. However, for the second preferred embodiment of the present invention, the preferred dopant ion is phosphorus. The phosphorus ion implant for formation of the source/drain electrodes 50 in accord with the second preferred embodiment of the present invention is preferably undertaken at about 1E14 to about 1E15 ions per square centimeter ion implantation dose and about 30 to about 80 keV ion implantation energy.

Figure 5E:
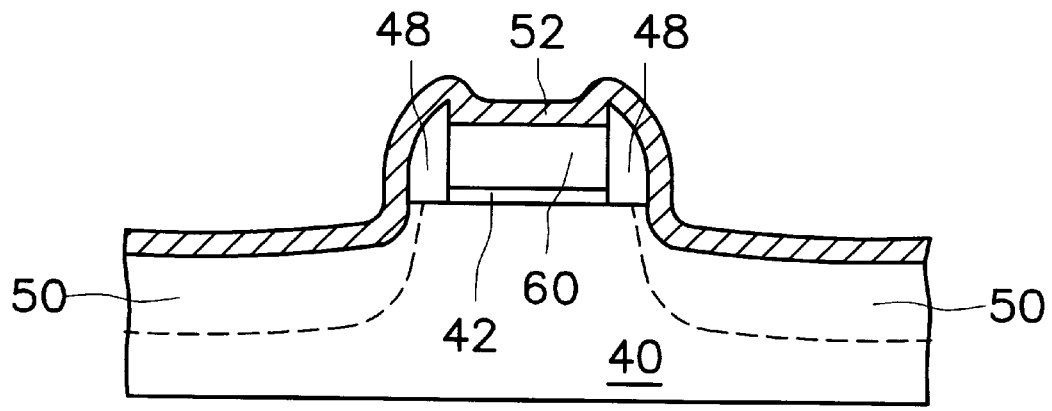

Referring now to FIG. 5e there is shown a schematic cross-sectional diagram of a field effect transistor showing the next process steps in accord with the second preferred embodiment of the present invention. Shown in FIG. 5e is the removal of the gate cap oxide 46 and the formation of a metal layer 52 over the surface at the transistor structure.

Removal of tile gate cap oxide 46 is a critical step in practice of the present invention. The gate cap oxide 46 is selectively removed with slight loss of thickness of gate spacer oxides 48 through use of an anisotropic Reactive Ion Etch (RIE) plasma process. The slight loss of thickness of the gate spacer oxides 48 is not critical to the field effect transistor of the present invention since the junction positions within the transistor have been defined prior to etching of the gate spacer oxides 48. The gate cap oxide 46 is etched for a time sufficient to assure its complete removal.

The choice of metal for the metal layer 52 is based upon the ability of the metal to form a salicide upon sintering with silicon surfaces which it contacts. Many metals for metal salicides. Typical choices for metals forming salicides include, but are not limited to platinum, titanium, cobalt, tungsten and tantalum. Metal layers may be formed upon semiconductor surfaces through several methods as are known in the art. Such methods include, but are not limited to thermal evaporation, electron beam assisted evaporation, Chemical Vapor Deposition (CVD) and sputtering.

For the second preferred embodiment of the present invention, the preferred metal for the metal layer 52 is titanium. The metal layer 52 is preferably deposited through a sputtering process to yield a metal layer 52 thickness of about 500 to about 2000 angstroms.

Figure 5F:
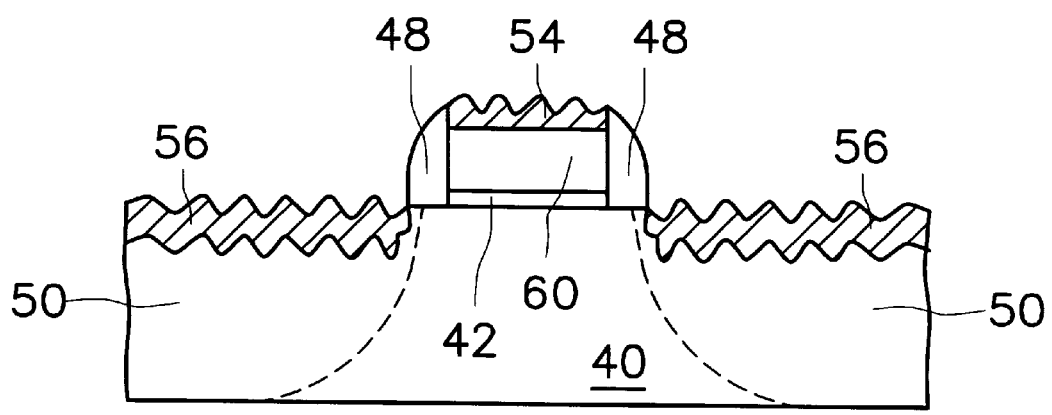

Referring now to FIG. 5f, there is shown d schematic cross-sectional diagram of a field effect transistor illustrating the last process steps of the second preferred embodiment of the present invention. Shown in FIG. 5f are the results of the simultaneous: (1) annealing and recrystallization of the amorphous source/drain electrodes 50 of FIG. 5e, and (2) sintering of the metal layer 52 to form a gate electrode metal salicide layer 54 and source/drain electrode metal salicide layers 56. Subsequent to these steps, unreacted portions of the metal layer 52 may be removed through an appropriate etch process. For the preferred metal titanium of the present invention, remaining portions of the metal layer 52 are preferably removed through exposure to a wet chemical etch solution comprised of ammonium hydroxide and hydrogen peroxide.

As shown in FIG. 5f, coincident with recrystallization of the source/drain electrodes 50 there is an additional thermal diffusion of tile phosphorus used for implanting those electrodes. The enhanced diffusion of phosphorus, in comparison with the arsenic used for ion implanting the source/drain electrodes 50 of the first preferred embodiment of the present invention, provides for an expansion of the source/drain electrodes 50 of the second preferred embodiment of the present invention to encompass the regions beneath the gate spacer oxides 48. Thus, the second preferred embodiment of the present invention yields a functional transistor without need for the low dose ion implants 58 used in the first preferred embodiment of the present invention.

Finally, FIG. 5f also shows the extent to which the gate electrode metal salicide layer 54 and the source/drain electrodes metal salicide layers 56 are restricted and contained by structures of the present invention which provide a field effect transistor with limited susceptibility to MEDs at its gate spacer oxides 48 edges. The field effect transistor structure of the second preferred embodiment of the present invention has a recessed polysilicon gate electrode 60 and recessed source/drain electrodes 50. Thus, metal salicide layers formed upon these electrodes are less likely to bridge to one another and cause parasitic leakage within field effect transistors of the second preferred embodiment of the present invention.

EXAMPLE 1

A conventional field effect transistor was formed upon a silicon semiconductor substrate water. The transistor was formed with a 140 angstrom thick gate oxide, a 3500 angstrom thick polysilicon gate electrode and a pair of 2000 angstrom thick gate spacer oxides. Arsenic ions were then implanted into the semiconductor substrate adjoining the gate spacer oxides to form a pair of amorphous source/drain electrodes. The arsenic ions were implanted at 5E15 ions per square centimeter implantation dose and 80 keV implantation energy. The transistor structure was then annealed for 30 minutes at 900 degrees centigrade.

The transistor structure was then cross-sectioned. Upon Scanning Electron Microscope (SEM) analysis of the cross-section, gate spacer MEDs were found within the semiconductor substrate at its juncture with the outer edge of the gate spacer oxides. Additional dislocations were observed within the semiconductor substrate beneath the polysilicon gate.

EXAMPLE 2

A field effect transistor similar to the first preferred embodiment of the present invention was formed upon a second silicon semiconductor substrate wafer. The transistor was formed With 140 angstrom thick gate oxide, a 3500 angstrom thick polysilicon gate electrode, an 800 angstrom thick gate cap oxide and a pair of 2000 angstrom thick gate spacer oxides. The semiconductor substrate adjoining the edges of the gate spacer oxides was then etched to remove approximately 1000 angstroms of the substrate to form a smooth topographic transition from the gate spacer oxides. Arsenic ions were then implanted into the etched semiconductor substrate adjoining the gate spacer oxides to form a pair of amorphous source/drain electrodes. The arsenic ions were implanted at 5E15 ions per square centimeter implantation dose and 80 keV implantation energy. The transistor structure was then annealed for 30 minutes at 900 degrees centigrade.

The transistor structure was then cross-sectioned. Upon Scanning Electron Microscope (SEM) analysis of the cross-section, no gate spacer MEDs were found within the semiconductor substrate at its juncture with the outer edge of the gate spacer oxides. No additional dislocations were observed within the semiconductor substrate beneath the polysilicon gate.

What is claimed is:

1. A method for forming a field effect transistor not susceptible to mask edge defects at its gate spacer oxide edges comprising:

providing a semiconductor substrate having formed thereupon a gate electrode on a gate oxide and a gate cap layer over the gate electrode, the semiconductor substrate having a horizontal primary surface;

forming a pair of curved, insulating gate spacers covering a pair of opposite edges of the gate electrode and the gate cap layer;

etching the semiconductor substrate adjoining the gate spacers to provide a pair of etched semiconductor substrate surfaces smoothly curving from the lower edges of the gate spacers to horizontal portions of the etched semiconductor substrate surfaces to provide a smooth topographic transition from the gate spacers to the horizontal portions;

implanting a dopant into the semiconductor substrate beneath the etched semiconductor substrate surfaces using the gate electrode, the gate cap layer and the gate spacers as a mask to form a pair of source/drain electrodes within the semiconductor substrate, wherein the dopant is implanted at a dosage and energy sufficient to render the pair of source/drain electrodes amorphous; and annealing the semiconductor substrate to provide a pair of source/drain electrodes consisting essentially of doped silicon regions on either side of the gate electrode so that surfaces of the source/drain electrodes consist essentially of doped silicon.

2. The method of claim 1 wherein the gate cap layer is an oxide layer from about 250 to about 1000 angstroms thick, and the oxide layer is formed through a Low Pressure Chemical Vapor Deposition process employing Tetra Ethyl Ortho Silicate as a source.

3. The method of claim 1 wherein the gate spacers are formed through an anistropic Reactive Ion Etch of a blanket silicon oxide layer formed upon the semiconductor substrate through a Low Pressure Chemical Vapor Deposition (LPCVD) process using a Tetra Ethyl Ortho Silicate (TEOS) source.

4. The method of claim 3 wherein the gate spacer oxides are about 1500 to about 2500 angstroms thick at the point of contact to the semiconductor substrate.

5. The method of claim 1 wherein the etching of the semiconductor substrate removes about 250 to about 1000 angstroms of the semiconductor substrate.

6. The method of claim 5 wherein the etching of the semiconductor substrate is accomplished through a selective Reactive Ion Etch process, wherein the selective Reactive Ion Etch process has an etch rate for silicon in excess of seven times an etch rate for silicon oxide.

7. The method of claim 1 wherein the source/drain electrodes are formed using an arsenic ion implant.

8. The method of claim 7 wherein the arsenic ion implant is undertaken at about 1E15 to about 1E16 ions per square centimeter ion implant dose and about 40 to about 80 keV ion implant energy.

9. The method of claim 1 wherein the source/drain electrodes are annealed at about 550 to about 900 degrees centigrade for about 30 to about 60 minutes.

10. The method of claim 1 further comprising a Lightly Doped Drain ion implant structure within the semiconductor substrate.

11. The method of claim 10 wherein the Lightly Doped Drain ion implant structure is formed from a low dose ion implant into the semiconductor substrate using a phosphorus ion implant at about 1E12 to about 1E13 ions per square centimeter ion implant dose and about 30 to about 50 keV ion implant energy.

12. The method of claim 1 further comprising a Doubly Doped Drain ion implant structure within the semiconductor substrate.

13. The method of claim 1, including the step of positioning the gate spacer oxides to be in contact with the gate oxide, gate electrode, gate cap oxide and semiconductor substrate.

14. A method for forming a field effect transistor not susceptible to mask edge defects at its gate spacer oxide edges comprising:

providing a semiconductor substrate having formed thereupon a polysilicon gate electrode aligned over a gate oxide and a gate cap oxide aligned over the polysilicon gate electrode, the semiconductor substrate having a horizontal primary surface;

forming a pair of curved gate spacer oxides covering a pair of opposite edges of the gate oxide, the polysilicon gate electrode and the gate cap oxide;

etching the semiconductor substrate adjoining the gate spacer oxides to provide a pair of etched semiconductor substrate surfaces which provide a smooth topographic transition from lower edges of the gate spacer oxides to horizontal surfaces of the etched semiconductor substrate surfaces;

implanting into the semiconductor substrate beneath the etched semiconductor surfaces using the polysilicon gate electrode, the gate cap oxide and the gate spacer oxides as a mask to form a pair of source/drain electrodes within the semiconductor substrate, wherein the dopant is implanted at a dosage and energy sufficient to render the pair of source/drain electrodes amorphous;

removing the gate cap oxide to expose the polysilicon gate electrode subsequent to said implanting;

forming a metal layer upon the polysilicon gate electrode and the source/drain electrodes; and annealing the source/drain electrodes and sintering the metal layer to form a gate electrode metal salicide layer and a pair of source/drain electrode metal salicide layers, the steps of annealing the source/drain electrodes and sintering the metal layer performed simultaneously.

15. The method of claim 14 wherein the gate cap oxide is from about 250 to about 1000 angstroms thick, and the gate cap oxide is formed through a Low Pressure Chemical Vapor Deposition process employing Tetra Ethyl Ortho Silicate as a silicon source material.

16. The method or claim 14 wherein the gate spacer oxides are formed through an anisotropic Reactive Ion Etch of a blanket silicon oxide layer formed upon the semiconductor substrate through a Low Pressure Chemical Vapor Deposition (LPCVD) process using a Tetra Ethyl Ortho Silicate (TEOS) silicon source material.

17. The method of claim 16 wherein the gate spacer oxides are about 1500 to about 2500 angstroms thick at the point of contact to the semiconductor substrate.

18. The method of claim 14 wherein the etching of the semiconductor substrate removes about 250 to about 1000 angstroms of the semiconductor substrate and the etching of the semiconductor substrate is accomplished through a selective Reactive Ion Etch process, wherein the selective Reactive Ion Etch process has an etch rate for silicon in excess of seven times an etch rate for silicon oxide.

19. The method of claim 14 wherein the step of implanting includes a phosphorus ion implant undertaken at about 1E14 to about 1E15 ions per square centimeter ion implant dose and about 30 to about 80 keV ion implant energy.

20. The method of claim 14 wherein the gate cap oxide is removed through a selective Reactive Ion Etch process.

21. The method of claim 14 further comprising a Lightly Doped Drain ion implant structure within the semiconductor substrate.

22. The method of claim 14 further comprising a Doubly Doped Drain ion implant structure within the semiconductor substrate.

23. The method of claim 14, including the step of positioning the gate spacer oxides to be in contact with the gate oxide, gate electrode, gate cap oxide and semiconductor substrate.

24. A method for forming a field effect transistor not susceptible to mask edge defects at its gate spacer oxide edges comprising:

providing a semiconductor substrate having formed thereupon a gate electrode aligned over a gate oxide and a gate cap oxide aligned over the gate electrode, the semiconductor substrate having a horizontal primary surface;

forming a pair of curved gate spacer oxides in contact with the semiconductor substrate and in contact with and covering a pair of opposite edges of the gate oxide, the gate electrode and the gate cap oxide;

etching the semiconductor substrate adjoining the gate spacer oxides to provide a pair of etched semiconductor substrate surfaces which provide a smooth topographic transition from the lower edges of the gate spacer oxides to the horizontal surfaces of the etched semiconductor substrate;

forming a pair of source/drain electrodes comprising amorphous ion implanted regions beneath the etched semiconductor substrate surface; and annealing the source/drain electrodes to form drain regions extending beneath the gate spacer oxides and along the etched semiconductor substrate surfaces.

* * * * *